(12) United States Patent
Lim et al.

(10) Patent No.: US 10,178,759 B2
(45) Date of Patent: Jan. 8, 2019

(54) BOARD APPARATUS

(71) Applicant: LSIS CO., LTD., Anyang-si, Gyeonggi-do (KR)

(72) Inventors: Deok-Young Lim, Anyang-si (KR); Chun-Suk Yang, Anyang-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 0 days.

(21) Appl. No.: 15/866,062

(22) Filed: Jan. 9, 2018

(65) Prior Publication Data

US 2018/0295716 A1 Oct. 11, 2018

(30) Foreign Application Priority Data

Apr. 5, 2017 (KR) ........................ 10-2017-0044339

(51) Int. Cl.
| | | |
|---|---|---|
| *H05K 7/00* | (2006.01) | |
| *H05K 1/02* | (2006.01) | |
| *H05K 3/32* | (2006.01) | |
| *H02M 1/44* | (2007.01) | |
| *H05K 3/22* | (2006.01) | |

(52) U.S. Cl.
CPC ............ *H05K 1/0239* (2013.01); *H02M 1/44* (2013.01); *H05K 1/0215* (2013.01); *H05K 1/0216* (2013.01); *H05K 1/0233* (2013.01); *H05K 1/0243* (2013.01); *H05K 1/0256* (2013.01); *H05K 1/0263* (2013.01); *H05K 3/222* (2013.01);
(Continued)

(58) Field of Classification Search
CPC ...... H02M 7/003; H02M 1/44; H05K 7/1417; H05K 7/1432; H05K 7/209; H05K 1/0215; H05K 1/0216; H05K 1/0233; H05K 1/0239; H05K 1/0243; H05K 1/0256; H05K 1/0263; H05K 2201/10409; H05K 3/222; H05K 3/32; F02D 17/02; F02D 2200/021; F02D 41/0087; F02D 41/1466; F02D 41/1467
See application file for complete search history.

(56) References Cited

U.S. PATENT DOCUMENTS

| | | | |
|---|---|---|---|
| 6,160,710 A | 12/2000 | Ahl et al. | |
| 6,493,233 B1* | 12/2002 | De Lorenzo | H05K 3/325 174/138 G |

(Continued)

FOREIGN PATENT DOCUMENTS

| | | |
|---|---|---|
| EP | 2346307 A2 | 7/2011 |
| KR | 2019990029379 U | 7/1999 |
| KR | 1020060014115 A | 2/2006 |

OTHER PUBLICATIONS

European Search Report for related European Application No. 18150694.0; action dated Jul. 20, 2018; (7 pages).

*Primary Examiner* — Yuriy Semenenko
(74) *Attorney, Agent, or Firm* — K&L Gates LLP

(57) ABSTRACT

Disclosed herein is a board apparatus including a printed circuit board, including a first ground wiring disposed on one surface of the printed circuit board; a second ground wiring disposed on the other surface of the printed circuit board; and a switch module disposed in an overlapped region between the first ground wiring and the second ground wiring, and including a bolt which penetrates through the printed circuit board and a nut which is in contact with the second ground wiring and is coupled to a screw of the bolt.

6 Claims, 4 Drawing Sheets

(52) U.S. Cl.
CPC ..... *H05K 3/32* (2013.01); *H05K 2201/10409* (2013.01)

(56) References Cited

U.S. PATENT DOCUMENTS

| | | | |
|---|---|---|---|
| 8,755,195 B2 | 6/2014 | Savory et al. | |
| 2006/0017157 A1* | 1/2006 | Yamamoto | H01L 23/66 257/728 |
| 2010/0025126 A1* | 2/2010 | Nakatsu | B60L 11/00 180/65.1 |
| 2011/0292552 A1* | 12/2011 | Chen | H05K 1/0215 361/56 |
| 2015/0124412 A1* | 5/2015 | Keegan | H02M 7/5387 361/734 |
| 2015/0189794 A1* | 7/2015 | Tashima | B62D 5/0406 180/446 |
| 2016/0164448 A1 | 6/2016 | Kane | |
| 2016/0285245 A1* | 9/2016 | Gaumon | H05K 7/1432 |

* cited by examiner

BOARD APPARATUS

CROSS-REFERENCE TO RELATED APPLICATIONS

Pursuant to 35 U.S.C. § 119(a), this application claims the benefit of earlier filing date and right of priority to Korean Patent Application No. 10-2017-0044339 filed on Apr. 5, 2017, in the Korean Intellectual Property Office, the disclosure of which is hereby incorporated by reference in its entirety.

BACKGROUND

1. Technical Field

The present disclosure relates to a board apparatus including a printed circuit board.

2. Description of the Related Art

A printed circuit board is provided to mount various active elements or various passive elements thereon, and to implement a circuit for a predetermined function. In addition, the printed circuit board includes a ground supply for electrical stability and noise emission of each circuit. When insulation of the ground supply is secured, that is, a ground environment is poor, stability and reliability of a board apparatus including the printed circuit board may be degraded.

As an example, the printed circuit board of a motor driving apparatus may be provided with an electromagnetic compatibility (EMC) filter for minimizing an introduction of EMC into a motor and an inverter for supplying a three-three alternating current (AC) signal to the motor.

Here, each of the EMC filter and the inverter is connected to the ground supply GND for electrical stability.

Since a typical ground supply GND supplies a voltage of 0V, whether or not a ground wiring of the EMC filter and a ground wiring of the inverter are electrically connected through the ground supply GND does not need to be considered.

In a case in which the ground environment of a place where the motor driving apparatus is installed is poor, however, the ground wiring of the EMC filter and the ground wiring of the inverter may be electrically connected through the ground supply GND. Thereby, the EMC emitted from the ground wiring of the EMC filter and conduction noise emitted from the ground wiring of the inverter may be introduced into the EMC filter or the inverter. In this case, stability and reliability of the apparatus may be degraded.

Therefore, the motor driving apparatus needs to include a switch for interrupting the connection between the ground wiring of the EMC filter and the ground wiring of the inverter, depending on the ground environment.

SUMMARY

It is an object of the present disclosure to provide a board apparatus including a switch for interrupting connection ground wirings depending on a ground environment.

Objects of the present disclosure are not limited to the above-described objects and other objects and advantages can be appreciated by those skilled in the art from the following descriptions. Further, it will be easily appreciated that the objects and advantages of the present disclosure can be practiced by means recited in the appended claims and a combination thereof.

In accordance with one aspect of the present disclosure, a board apparatus including a printed circuit board includes a first ground wiring disposed on one surface of the printed circuit board; a second ground wiring disposed the other surface of the printed circuit board; and a switch module disposed in an overlapped region between the first ground wiring and the second ground wiring, and including a bolt which penetrates through the printed circuit board and a nut which is in contact with the second ground wiring and is coupled to a screw of the bolt.

Each of the bolt and the nut may be formed of a conductive material, and the switch module may further include an insulating member which is disposed between a head of the bolt and the first ground wiring and insulates between the bolt and the first ground wiring.

When the switch module includes the insulating member, the switch module may interrupt the connection between the first and second ground wirings, and when the switch module does not include the insulating member, the switch module may connect between the first and second ground wirings.

The board apparatus may further include a heat sink facing the other surface of the printed circuit board. In this case, the nut may be coupled to a screw of the bolt in a state in which the nut is fixed to the heat sink.

DETAILED DESCRIPTION

Figure 1:
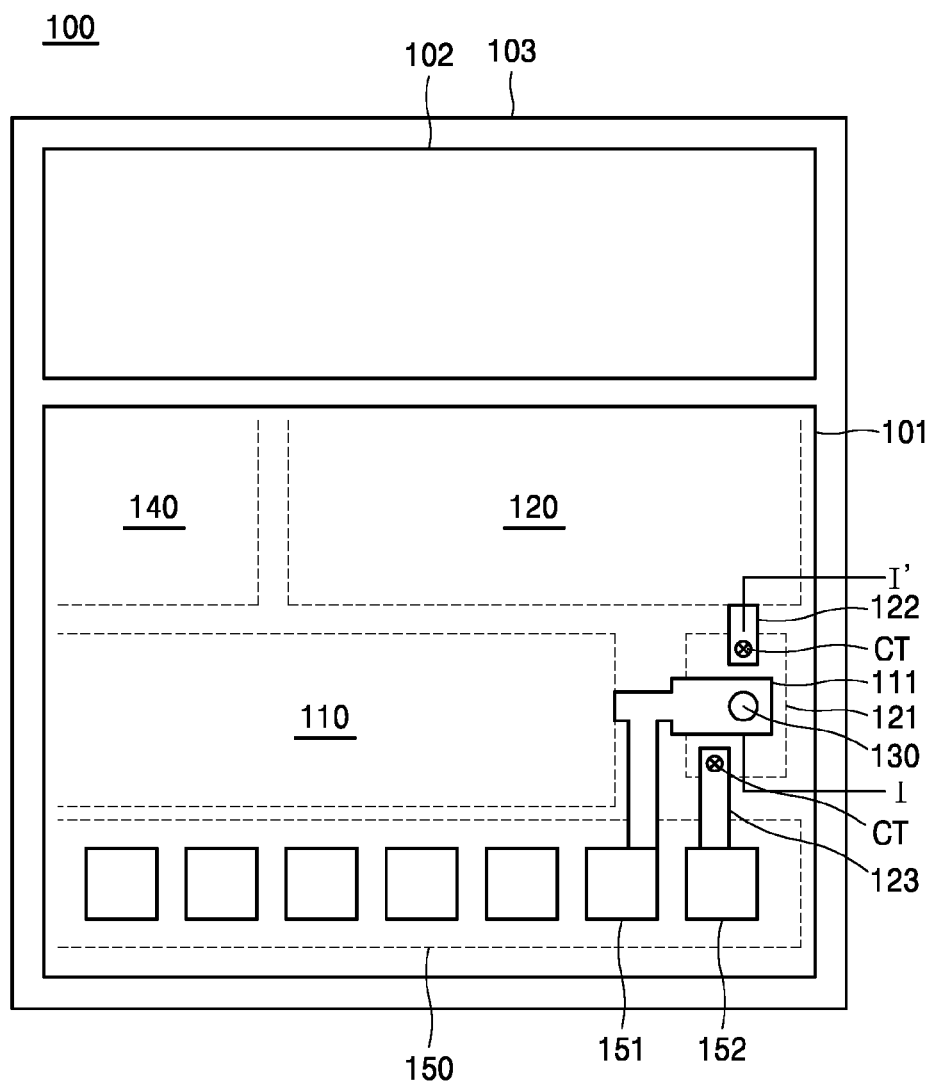
FIG. 1 is a view illustrating one example of a motor driving apparatus according to an exemplary embodiment of the present disclosure.

The above objects, features and advantages will become apparent from the detailed description with reference to the accompanying drawings. Embodiments are described in sufficient detail to enable those skilled in the art in the art to easily practice the technical idea of the present disclosure. Detailed descriptions of well known functions or configurations may be omitted in order not to unnecessarily obscure the gist of the present disclosure. Hereinafter, embodiments of the present disclosure will be described in detail with reference to the accompanying drawings. Throughout the drawings, like reference numerals refer to like elements.

Hereinafter, a board apparatus according to an exemplary embodiment of the present disclosure will be described in detail with the accompanying drawings. In the following description, a motor driving apparatus of the board apparatus will be described by way of example as an exemplary embodiment of the present disclosure.

Figure 2:
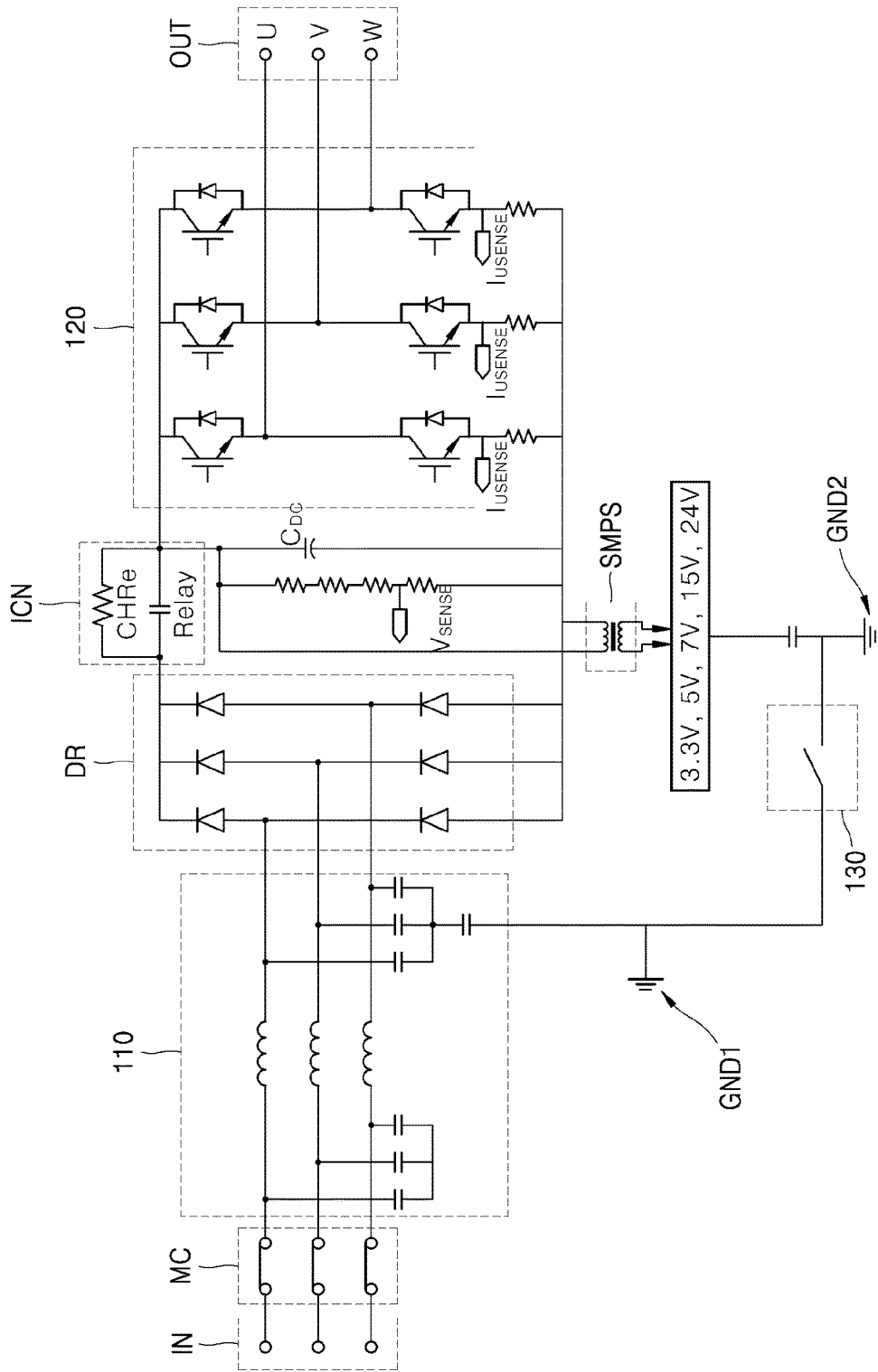
FIG. 2 is a view illustrating one example of an equivalent circuit of a printed circuit board of FIG. 1.
Figure 3:
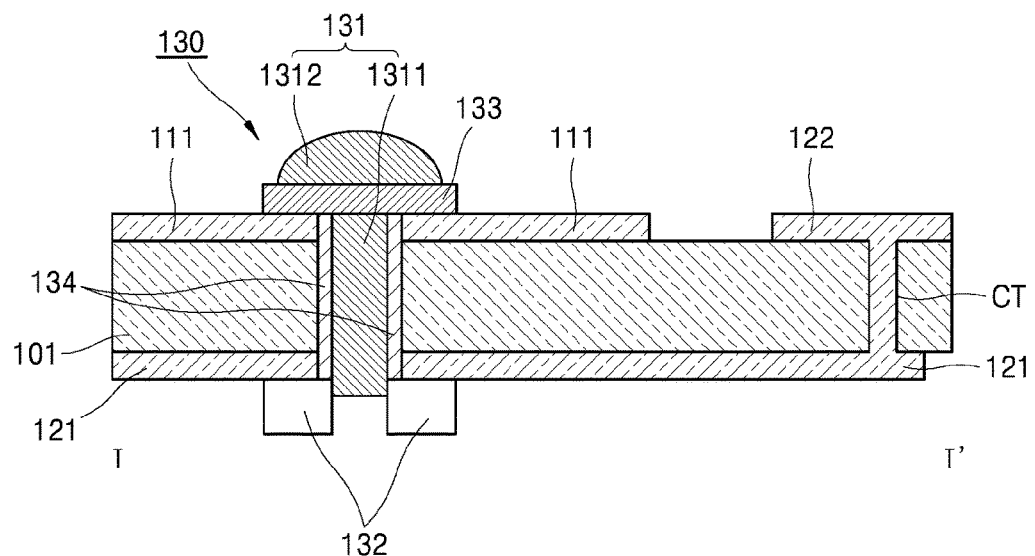
FIGS. 3 and 4 illustrate examples of a cross section taken along line I-I' of FIG. 1.
Figure 4:
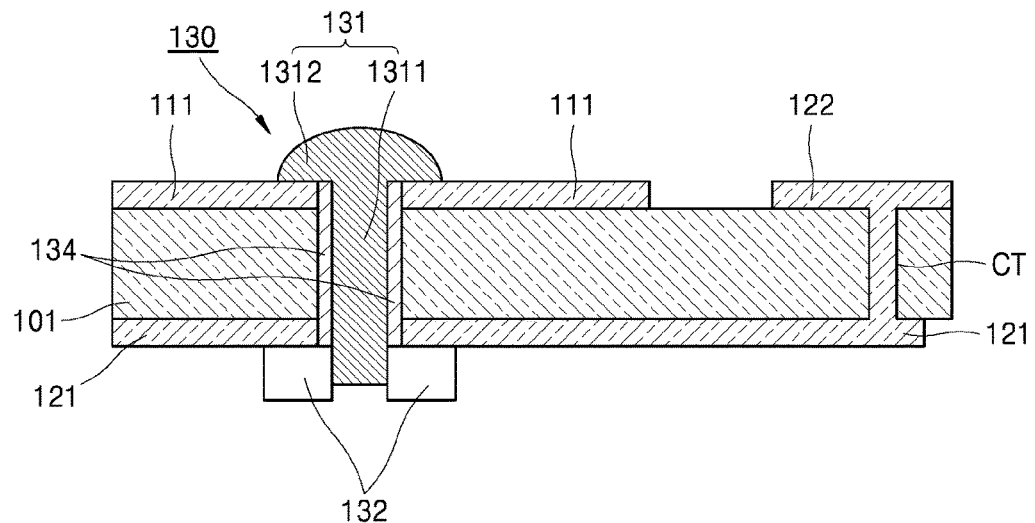
Figure 5:
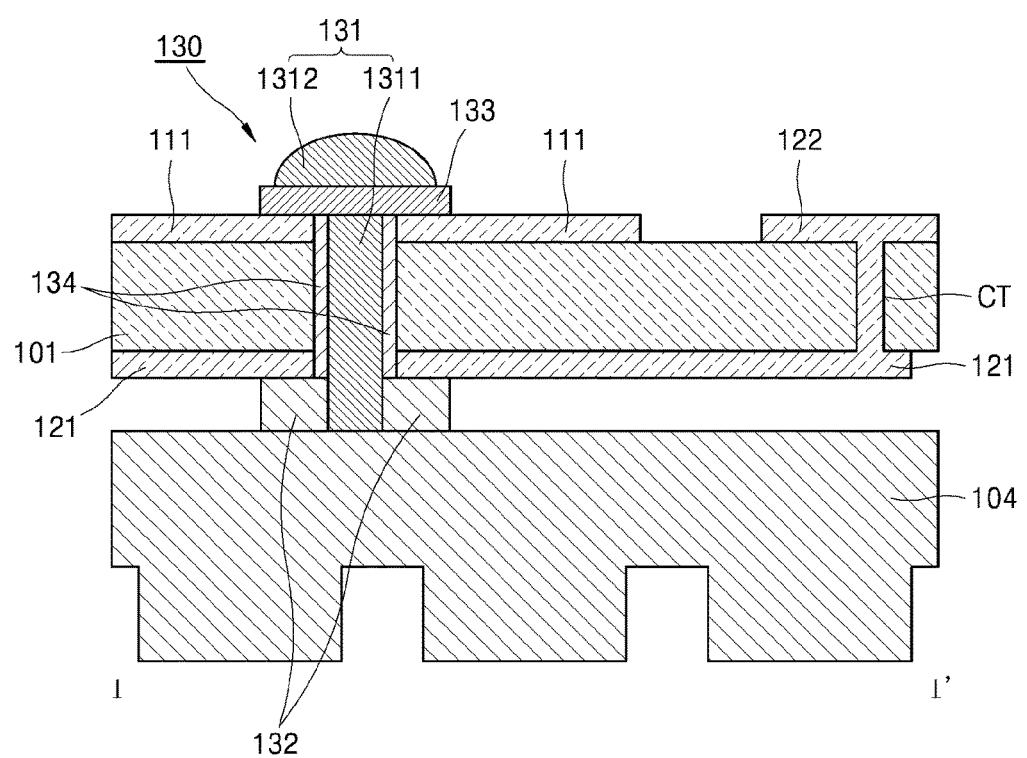
FIG. 5 illustrates another example of the cross section taken along line I-I' of FIG. 1.

FIG. 1 is a view illustrating one example of a motor driving apparatus according to an exemplary embodiment of the present disclosure. FIG. 2 is a view illustrating one example of an equivalent circuit of a printed circuit board of FIG. 1. FIGS. 3 and 4 illustrate examples of cross sections taken along line I-I' of FIG. 1. FIG. 5 illustrates another example of the cross section taken along line I-I' of FIG. 1.

As illustrated in FIG. 1, a motor driving apparatus 100 includes a printed circuit board 101, an input and output window 102, and a case 103 hosing the printed circuit board 101 and the input and output window 102.

Although not illustrated in detail, the input and output window 102 may include buttons to which commands of a user for a motor are input, and a state display window that displays a driving state of the motor.

The motor driving apparatus 100 further includes an EMC filter 110 disposed on the printed circuit board 101, a first ground wiring 111 corresponding to the EMC filter 110, second, third, and fourth ground wirings 121, 122, and 123 corresponding to an inverter 120, and a switch module 130 that selectively connects between the first ground wiring 111 and the second ground wiring 121.

In addition, the motor driving apparatus 100 may further include an inverter driver 140 which is disposed on the printed circuit board 101 and controls a driving of the inverter 120 based on the command of the user which is input through the input and output window 102. For example, the inverter driver 140 may supply a pulse width modulation (PWM) control signal for performing an ON-FF driving for each switch of the inverter 120.

Further, the motor driving unit 100 may further include a pad 150 disposed on the printed circuit board 101.

The pad 150 includes a first ground pad 151 connected to the first ground wiring 111 corresponding to the EMC filter 110 and a second ground pad 152 connected to the fourth ground wiring 123 corresponding to the inverter 120.

As illustrated in FIG. 2, the motor driving apparatus 100 according to an exemplary embodiment of the present disclosure includes the EMC filter 110, the inverter 120, and the inverter driver 140.

In addition, the motor driving apparatus 100 may further include a diode rectifier (DR), an initial charging network (ICN), and a direct current (DC) capacitor $C_{DC}$ which are connected between the EMC filter 110 and the inverter 120. Further, the motor driving apparatus 100 may further include a power supply SMPS connected to the DC capacitor $C_{DC}$.

The motor driving apparatus 100 may be disposed between an input terminal IN to which alternating current (AC) power is input and the EMC filter 110, and may further include a magnet contact MC corresponding to each phase.

The EMC filter 110 filters EMC from the AC power, emits the EMC to a ground GND, and outputs the filtered AC power.

Such an EMC filter 110 is connected to a first ground supply GND1 by being connected to the first ground pad 151 through the first ground wiring 111.

The diode rectifier DR rectifies the AC power which is filtered by the EMC filter 110.

The initial charging network ICN includes a charging resistor CRRe and a relay which are connected in parallel to each other.

When the relay is turned-on, the DC capacitor $C_{DC}$ is charged by an output of the diode rectifier DR.

The power supply SMPS includes at least one switching regulator. Such a power supply SMPS converts a voltage charged in the DC capacitor $C_{DC}$ connected to a primary side of the switching regulator and supplies a DC voltage having a predetermined level to a load connected to a secondary side of the switching regulator. That is, the power supply SMPS supplies the DC voltage for driving the inverter driver 140, or the like. For example, the power supply SMPS may supply at least one of 3.3V, 5V, 7V, 15V, and 24V.

The inverter 120 includes switches having a three-phase bridge connection structure. Such an inverter 120 generates a three-phase AC signal based on the voltage charged in the DC capacitor $C_{DC}$, and supplies the three-phase AC signal to a motor (not shown) through an output terminal OUT.

Here, the switches of the inverter 120 are driven to be turned-on/off based on the PWM control signal of the inverter driver 140.

In addition, the inverter 120 needs to emit conduction noise generated when the three-phase AC signal is generated. Accordingly, the inverter 120 is connected to a second ground supply GND2 by being connected to the second ground pad 152 through the second, third, and fourth ground wirings 121, 122, and 123 (FIG. 1).

The switch module 130 selectively interrupts a connection between the first ground supply GND1 connected to the EMC filter 110 and the second ground supply GND2 connected to the inverter 120.

As an example, in a case in which the motor driving apparatus 100 is installed in a place in which a ground environment is poor, the EMC filter 110 and the inverter 120 may be connected to each other through the first and second ground supplies GND1 and GND2. In this case, the EMC and the conduction noise may be again introduced into at least any one of the EMC filter 110 and the inverter 120 of the motor driving apparatus 100. That is, there is a problem that the EMC and the conduction noise are not appropriately emitted through the ground supply GND.

Accordingly, the motor driving apparatus 100 according to an exemplary embodiment of the present disclosure includes the switch module 130 for selectively interrupting the connection between the first and second ground supplies GND1 and GND2 depending on the ground environment. Thereby, malfunction of the motor driving apparatus 100 due to the poor ground environment may be prevented.

As illustrated in FIG. 3, the motor driving apparatus 100 includes the first ground wiring 111 disposed on one surface of the printed circuit board 101, the second ground wiring 121 disposed on the other surface of the printed circuit board 101, and the switch module disposed in an overlapped region between the first ground wiring 111 and the second ground wiring 121.

Here, the first ground wiring 111 may be connected to the EMC filter 110, and the second ground wiring 121 may be connected to the inverter 120. This is merely illustrative, however, the first ground wiring 111 may also be connected to the inverter 120, and the second ground wiring 121 may also be connected to the EMC filter 110.

In addition, referring to FIG. 1, the motor driving apparatus 100 further includes the third and fourth ground wirings 122 and 123 disposed on one surface of the printed circuit board 101, and the third and fourth ground wirings 122 and 123 are connected to the second ground wiring 121 disposed on the other surface of the printed circuit board 101 through the respective contact holes CT.

That is, as illustrated in FIG. 3, the second ground wiring 121 is connected to the third ground wiring 122 disposed on one surface of the printed circuit board 101 through the contact hole CT.

The switch module 130 includes a bolt 131 that penetrates through the printed circuit board 101, a nut 132 which is in contact with the second ground wiring 121 and is coupled to a screw 1311 of the bolt 131, an insulating member 133 disposed between a head 1312 of the bolt 131 and the first ground wiring 111, and an insulating hole 134 disposed between the screw 1311 of the bolt 131 and the printed circuit board 101. Here, each of the bolt 131 and the nut 132 is formed of a conductive material.

The head 1312 of the bolt 131 faces one surface of the printed circuit board 101, and the screw 1311 of the bolt 131 is inserted into the insulating hole 134. The insulating member 133 is disposed between the head 1312 of the bolt 131 and the first ground wiring 111, and the insulating hole 134 is disposed between the screw 1311 of the bolt 131 and the printed circuit board 101. Here, the insulating member 133 may be an insulating washer.

By such an insulating member 133 and an insulating hole 134, a contact between the head 1312 of the bolt 131 and the first ground wiring 111 may be interrupted.

That is, the insulating member is disposed, thereby interrupting a connection between the bolt 131 and the first ground wiring 111.

On the other hand, as illustrated in FIG. 4, when the switch module 130 does not include the insulating member 133, the head 1312 of the bolt 131 is in contact with the first ground wiring 111. Such a bolt 131 is electrically connected to the first ground wiring 111.

The nut 132 is disposed on the other surface of the printed circuit board, and is in contact with the second ground wiring 121.

Thereby, the switch module 130 connect the first and second ground wirings 111 and 121 with each other through the bolt 131 and the nut 132 which are in contact with the first and second ground wirings 111 and 121.

In other words, when the switch module 130 according to an exemplary embodiment of the present disclosure includes the insulating member 133 disposed between the bolt 131 and the first ground wiring 111, the switch module 130 interrupts the connection between the first and second ground wirings 111 and 121. On the contrary to this, when the switch module 130 does not include the insulating member, the switch module 130 connect between the first and second ground wirings 111 and 121.

As described above, the motor driving apparatus 100 according to an exemplary embodiment of the present disclosure includes the first ground wiring 111 between the EMC filter 110 and the ground supply GND1, the second ground wiring 121 between the inverter 120 and the ground supply GND2, and the switch module 130 that selectively interrupts the connection between the first and second ground wirings 111 and 121.

In a case in which the ground environment of the place in which the motor driving apparatus 100 is installed is poor, the ground supply GND1 of the EMC filter 110 and the ground supply GND2 of the inverter 120 may be easily interrupted by such a switch module 130. As a result, it is possible to prevent the EMC or the noise emitted from the EMC filter 110 and the inverter 120 from being introduced into the motor driving apparatus 100 through the ground wirings GND1 and GND2.

The switch module 130 includes the bolt 131 and the nut 132 which are screw-connected with each other. In addition, the switch module 130 selectively includes the insulating member which is inserted between the bolt 131 and the nut 132. Depending on whether or not such an insulating member is disposed, the connection between the bolt 131 and the first ground wiring 111 may be selectively interrupted.

By such a screw connection between the bolt 131 and the nut 132, it is possible to prevent the switch module 130 from being easily detached from the printed circuit board 101.

That is, the screw connection between the bolt 131 and the nut 132 has more rigid fixing force, as compared to a switch module of a jumper type which is coupled in an insertion structure. Therefore, the switch module 130 having the structure including the bolt 131 and the nut 132 may be stably fixed to the printed circuit board 101. Thereby, reliability and stability of the motor driving apparatus 100 may be further improved.

Meanwhile, according to an exemplary embodiment of the present disclosure, as the switch module includes the bolt 131 and the nut 132 which are screw-connected with each other, other modules may be fixed to the printed circuit board 101 using the switch module 130.

As illustrated in FIG. 5, the motor driving apparatus 100 may further include a heat sink 104 for easily emitting heat generated from the printed circuit board 101, or the like.

In this case, the nut 132 of the switch module 130 is coupled to the screw 1311 of the bolt 131 in a state in which the nut 132 is fixed to the heat sink 104. That is, the nut 132 may be provided as a portion of the heat sink 104.

Alternatively, although not illustrated in FIG. 5, the nut 132 may also be fixed to the heat sink 104 through a predetermined fixing member in a state in which the nut 132 is coupled to the bolt 131. Here, as the fixing member, an adhesive or a double-sided tape may be selected.

In this way, the heat sink 104 may be fixed to the printed circuit board 101 through the bolt 131 and the nut 132 of the switch module 130. Thereby, since a separate member form fixing the heat sink 104 may be omitted, it may be advantageously performed to simplify and lighten the motor driving apparatus 100.

As described above, the board apparatus as described above includes the switch module which is disposed in the overlapped region between the first and second ground wirings. The switch module includes the bolt that penetrates through the board, and the nut coupled to the bolt. In addition, the switch module may further include the insulating member which is disposed between the bolt and the first ground wiring.

Depending on whether or not the switch module includes the insulating member, such a switch module may selectively interrupt the connection between the first and second ground wirings. That is, when the switch module includes the insulating member between the bolt and the first ground wiring, the switch module interrupts the connection between the first and second ground wirings. On the other hand, when the switch module does not include the insulating member, the switch module connects the first and second ground wirings to each other.

Since the board apparatus includes such a switch module, it may be easy for the board apparatus to selectively interrupt the connection between the first and second ground wirings depending on the ground environment of the place where the board apparatus is installed. Therefore, reliability and stability of the board apparatus may be improved.

Further, since the heat sink may be fixed to the printed circuit board through a screw connection between the bolt and the nut of the switch module, a separate member for fixing the heat sink may be omitted. As a result, it may be advantageously performed to simplify and lighten the board apparatus.

The present disclosure described above may be variously substituted, altered, and modified by those skilled in the art to which the present invention pertains without departing from the scope and sprit of the present disclosure. Therefore, the present disclosure is not limited to the above-mentioned exemplary embodiments and the accompanying drawings.

What is claimed is:

1. A board apparatus including a printed circuit board, the board apparatus comprising:
   an electromagnetic compatibility (EMC) filter disposed on the printed circuit board and filtering EMC;
   an inverter disposed on the printed circuit board and supplying a three-phase alternating current (AC) signal to a motor;
   a first ground wiring disposed on one surface of the printed circuit board and connecting between the EMC filter and a first ground supply;

a second ground wiring disposed on the other surface of the printed circuit board and connecting between the inverter and a second ground supply;

a switch selectively interrupting a connection between the first ground wiring and the second ground wiring, wherein the switch is disposed in an overlapped region between the first ground wiring and the second ground wiring, and includes a bolt which penetrates through the printed circuit board, a nut which is in contact with the second ground wiring and is coupled to a screw of the bolt; and an insulating member which is disposed between a head of the bolt and the first ground wiring, wherein each of the bolt and the nut is formed of a conductive material, and wherein the insulating member insulates between the bolt and the nut.

2. The board apparatus of claim 1, wherein when the switch includes the insulating member, the switch interrupts the connection between the first and second ground wirings, and when the switch does not include the insulating member, the switch connects between the first and second ground wirings.

3. The board apparatus of claim 1, wherein the insulating member is an insulating washer.

4. The board apparatus of claim 1, wherein the switch further includes an insulating hole disposed between the screw of the bolt and the printed circuit board.

5. The board apparatus of claim 1, further comprising:

a third ground wiring connected to the second ground wiring through a contact hole which penetrates through the printed circuit board, wherein the inverter is connected to the second ground supply through the second and third ground wirings.

6. The board apparatus of claim 1, further comprising a heat sink facing the other surface of the printed circuit board and fixed to the nut.

\* \* \* \* \*